US012694189B2

(12) United States Patent
Sun et al.

(10) Patent No.: US 12,694,189 B2
(45) Date of Patent: Jul. 28, 2026

(54) METHOD OF SHUTTLE MASK

(71) Applicant: United Microelectronics Corp., Hsinchu (TW)

(72) Inventors: Chia-Chen Sun, Kaohsiung City (TW); En-Chiuan Liou, Tainan City (TW)

(73) Assignee: United Microelectronics Corp., Hsinchu (TW)

( * ) Notice: Subject to any disclaimer, the term of this patent is extended or adjusted under 35 U.S.C. 154(b) by 776 days.

(21) Appl. No.: 18/179,391

(22) Filed: Mar. 7, 2023

(65) Prior Publication Data

US 2024/0202417 A1 Jun. 20, 2024

(30) Foreign Application Priority Data

Dec. 16, 2022 (CN) .......................... 202211624105.5

(51) Int. Cl.
*G06F 30/39* (2020.01)
*G03F 1/70* (2012.01)
*G06F 30/392* (2020.01)

(52) U.S. Cl.
CPC .............. *G06F 30/392* (2020.01); *G03F 1/70* (2013.01)

(58) Field of Classification Search
USPC ................................... 716/51, 52, 53, 54, 55
See application file for complete search history.

(56) References Cited

U.S. PATENT DOCUMENTS

| | | | |
|---|---|---|---|
| 2005/0205961 A1* | 9/2005 | Doong | H01L 21/76232 |
| | | | 257/E21.549 |
| 2009/0321870 A1 | 12/2009 | Chen et al. | |
| 2012/0319246 A1 | 12/2012 | Tan et al. | |
| 2014/0331191 A1* | 11/2014 | Wu | G06F 30/398 |
| | | | 716/53 |

* cited by examiner

*Primary Examiner* — Brian Ngo
(74) *Attorney, Agent, or Firm* — JCIPRNET

(57) ABSTRACT

A design method of a shuttle mask including the following steps is provided. A first integrated circuit (IC) design is provided in a first chip region, and a second IC design is provided in a second chip region. The first IC design includes first main patterns. The second IC design includes second main patterns. First dummy insertion patterns are added in the first chip region, and second dummy insertion patterns are added in the second chip region. The first main patterns and the first dummy insertion patterns are separated from each other. The first dummy insertion patterns are patterns formed by duplicating at least one of the first main patterns. The second main patterns and the second dummy insertion patterns are separated from each other. The second dummy insertion patterns are patterns formed by duplicating at least one of the second main patterns.

19 Claims, 5 Drawing Sheets

METHOD OF SHUTTLE MASK

CROSS-REFERENCE TO RELATED APPLICATION

This application claims the priority benefit of China application serial no. 202211624105.5, filed on Dec. 16, 2022. The entirety of the above-mentioned patent application is hereby incorporated by reference herein and made a part of this specification.

BACKGROUND

Technical Field

The invention relates to a design method of a photomask, and particularly relates to a design method of a shuttle mask.

Description of Related Art

Currently, the industry often uses a shuttle mask solution to save research and development (R&D) cost. This solution is to combine the integrated circuit (IC) designs of the IC design owners on the same shuttle mask to share the cost. Since the IC designs of the IC design owners are combined on the shuttle mask, the multi-project wafer (MPW) formed by the shuttle mask has the integrated circuits (ICs) of all the IC design owners. Therefore, how to effectively prevent the IC design owner from knowing the IC design of the other IC design owner from the multi-project wafer is the goal of continuous efforts.

SUMMARY

The invention provides a design method of a shuttle mask, which can effectively prevent the IC design owner from knowing the IC design of the other IC design owner from the multi-project wafer.

The invention provides a design method of a shuttle mask, which includes the following steps. A first IC design is provided in a first chip region, and a second IC design is provided in a second chip region. The first IC design includes first main patterns. The second IC design includes second main patterns. First dummy insertion patterns are added in the first chip region, and second dummy insertion patterns are added in the second chip region. The first main patterns and the first dummy insertion patterns are separated from each other. The first dummy insertion patterns are patterns formed by duplicating at least one of the first main patterns. The second main patterns and the second dummy insertion patterns are separated from each other. The second dummy insertion patterns are patterns formed by duplicating at least one of the second main patterns.

According to an embodiment of the invention, in the design method of the shuttle mask, the method of adding the first dummy insertion patterns in the first chip region may include randomly adding the first dummy insertion patterns in the first chip region.

According to an embodiment of the invention, in the design method of the shuttle mask, the method of adding the second dummy insertion patterns in the second chip region may include randomly adding the second dummy insertion patterns in the second chip region.

According to an embodiment of the invention, the design method of the shuttle mask may further include the following step. After adding the first dummy insertion patterns in the first chip region and adding the second dummy insertion patterns in the second chip region, it is determined whether the number of layers of the first back end of line (BEOL) structure of the first IC design is the same as the number of layers of the second BEOL structure of the second IC design.

According to an embodiment of the invention, the design method of the shuttle mask may further include the following step. The design process of the shuttle mask is ended when the number of layers of the first BEOL structure of the first IC design is not the same as the number of layers of the second BEOL structure of the second IC design.

According to an embodiment of the invention, the design method of the shuttle mask may further include the following step. At least one dummy line is added in the second chip region when the number of layers of the first BEOL structure of the first IC design is the same as the number of layers of the second BEOL structure of the second IC design. The at least one dummy line may be connected to at least two selected from the second main patterns and the second dummy insertion patterns.

According to an embodiment of the invention, the design method of the shuttle mask may further include the following step. After adding the at least one dummy line in the second chip region, the design process of the shuttle mask is ended.

According to an embodiment of the invention, in the design method of the shuttle mask, the method of adding the at least one dummy line in the second chip region may include randomly adding the at least one dummy line in the second chip region.

According to an embodiment of the invention, in the design method of the shuttle mask, the at least one dummy line may have a first side and a second side. The second side is located between the first side and the center of the second chip region. The number of the second dummy insertion patterns connected to the first side may be two or more.

According to an embodiment of the invention, in the design method of the shuttle mask, the at least one dummy line may have a first side and a second side. The second side is located between the first side and the center of the second chip region. The number of the second dummy insertion patterns connected to the second side may be less than two.

According to an embodiment of the invention, in the design method of the shuttle mask, the at least one dummy line may have a first side and a second side. The second side is located between the first side and the center of the second chip region. The number of the second dummy insertion patterns connected to the first side may be less than two.

According to an embodiment of the invention, in the design method of the shuttle mask, the at least one dummy line may have a first side and a second side. The second side is located between the first side and the center of the second chip region. The number of the second dummy insertion patterns connected to the second side may be two or more.

According to an embodiment of the invention, in the design method of the shuttle mask, two or more of the first main patterns may have different shapes.

According to an embodiment of the invention, in the design method of the shuttle mask, two or more of the first main patterns may have the same shape.

According to an embodiment of the invention, in the design method of the shuttle mask, two or more of the second main patterns may have different shapes.

According to an embodiment of the invention, in the design method of the shuttle mask, two or more of the second main patterns may have the same shape.

According to an embodiment of the invention, in the design method of the shuttle mask, two or more of the first dummy insertion patterns may have different shapes.

According to an embodiment of the invention, in the design method of the shuttle mask, two or more of the first dummy insertion patterns may have the same shape.

According to an embodiment of the invention, in the design method of the shuttle mask, two or more of the second dummy insertion patterns may have different shapes.

According to an embodiment of the invention, in the design method of the shuttle mask, two or more of the second dummy insertion patterns may have the same shape.

Based on the above description, in the design method of the shuttle mask according to the invention, the first dummy insertion patterns are added in the first chip region, and the second dummy insertion patterns are added in the second chip region. The first main patterns and the first dummy insertion patterns are separated from each other, the first dummy insertion patterns are patterns formed by duplicating at least one of the first main patterns, the second main patterns and the second dummy insertion patterns are separated from each other, and the second dummy insertion patterns are patterns formed by duplicating at least one of the second main patterns. Therefore, the design method of the shuttle mask according to the invention can effectively prevent the IC design owner from knowing the IC design of the other IC design owner from the multi-project wafer. In addition, the design method of the shuttle mask according to the invention can improve the uniformity of the pattern density on the shuttle mask.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2C are top views illustrating a design process of a shuttle mask according to some embodiments of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

Figure 1:
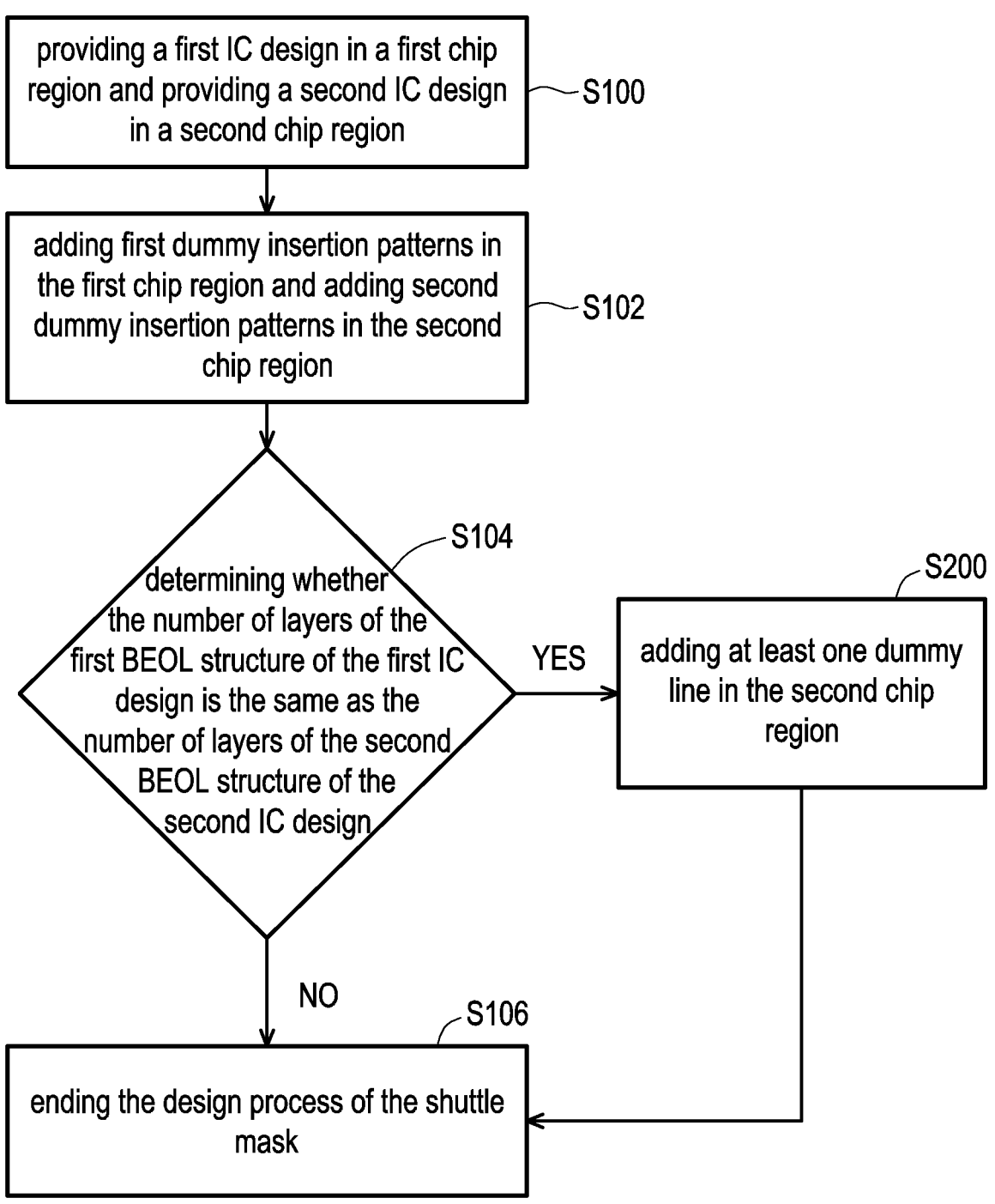
FIG. 1 is a flow chart illustrating a design method of a shuttle mask according to some embodiments of the invention.
Figure 2A:
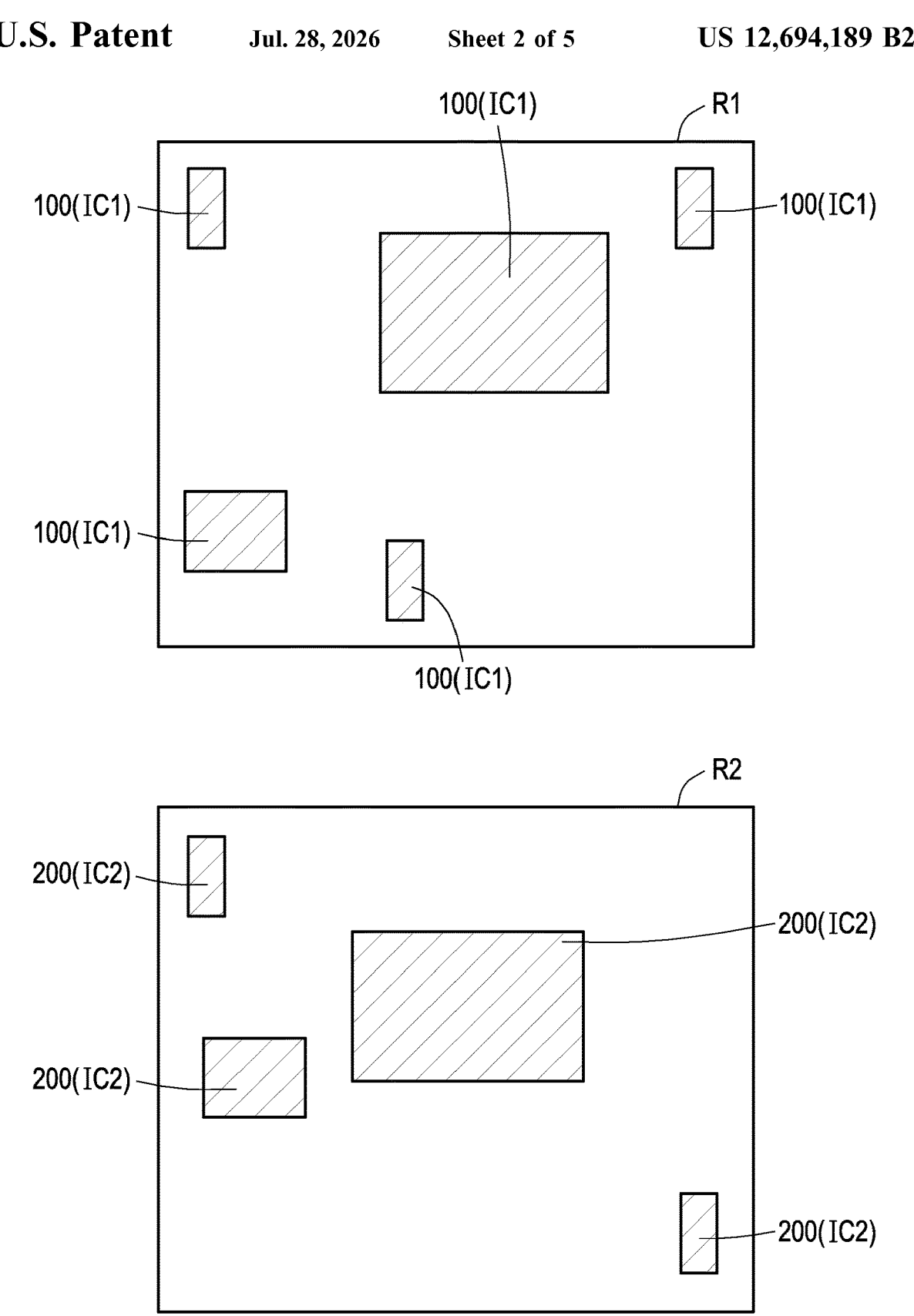
Figure 2B:
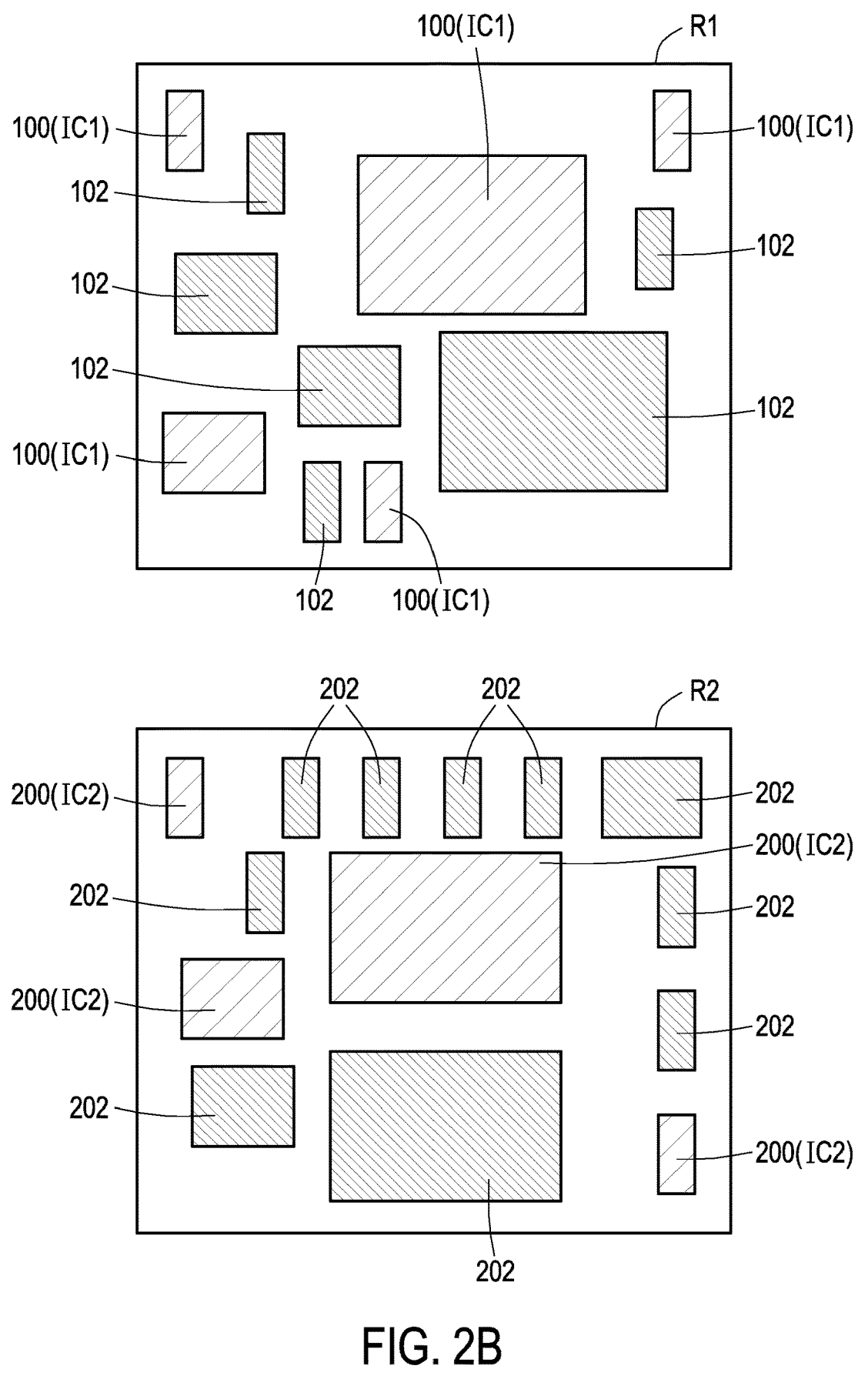
Figure 2C:
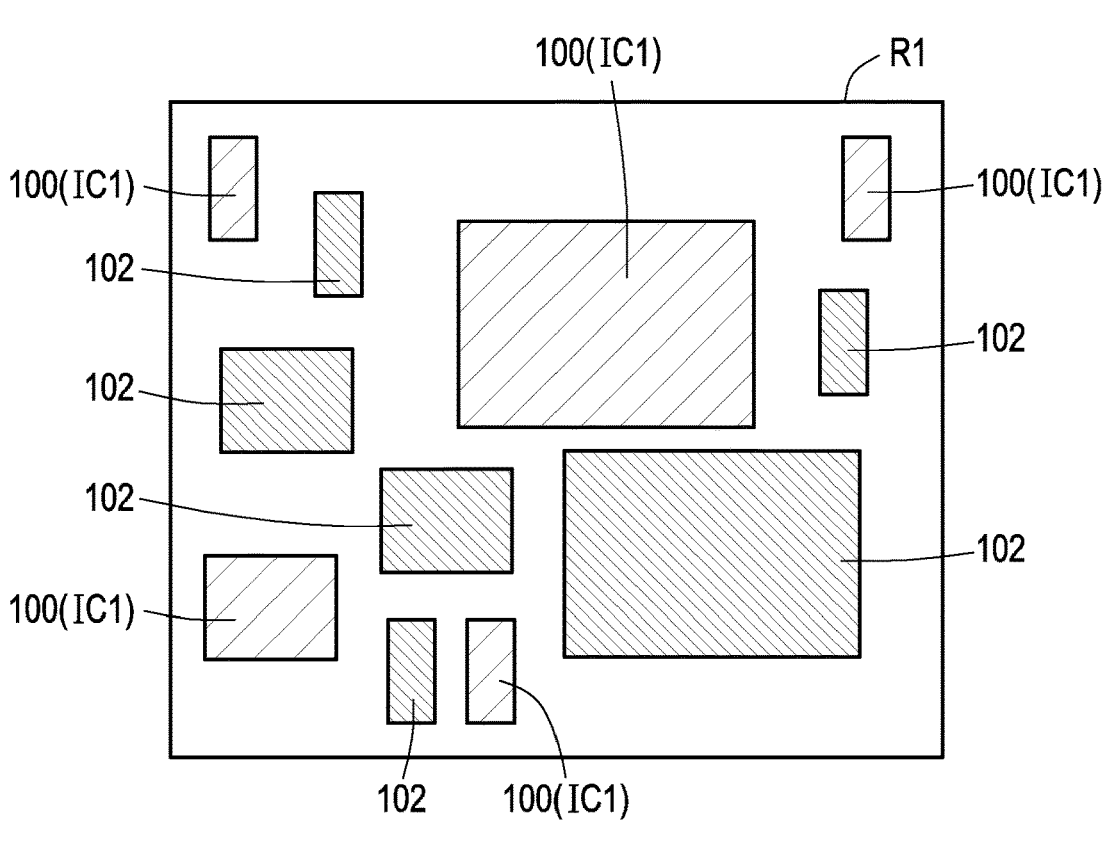
Figure 2C:
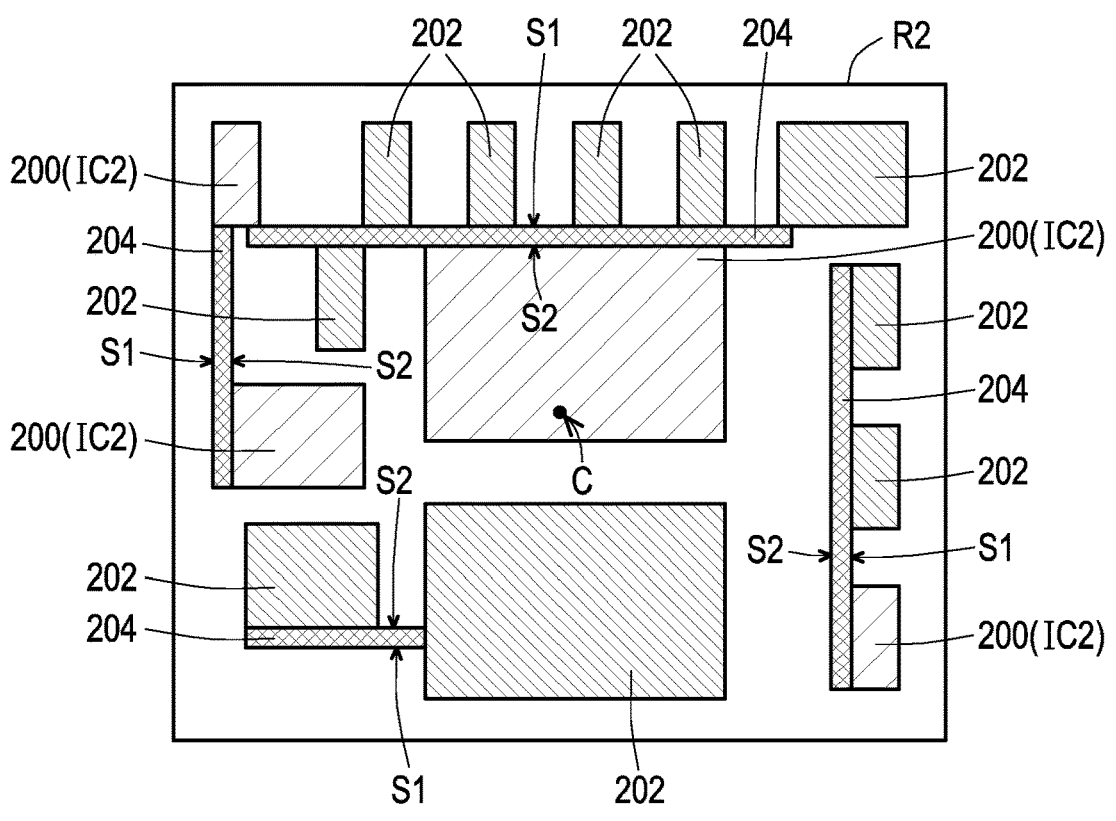
Figure 3:
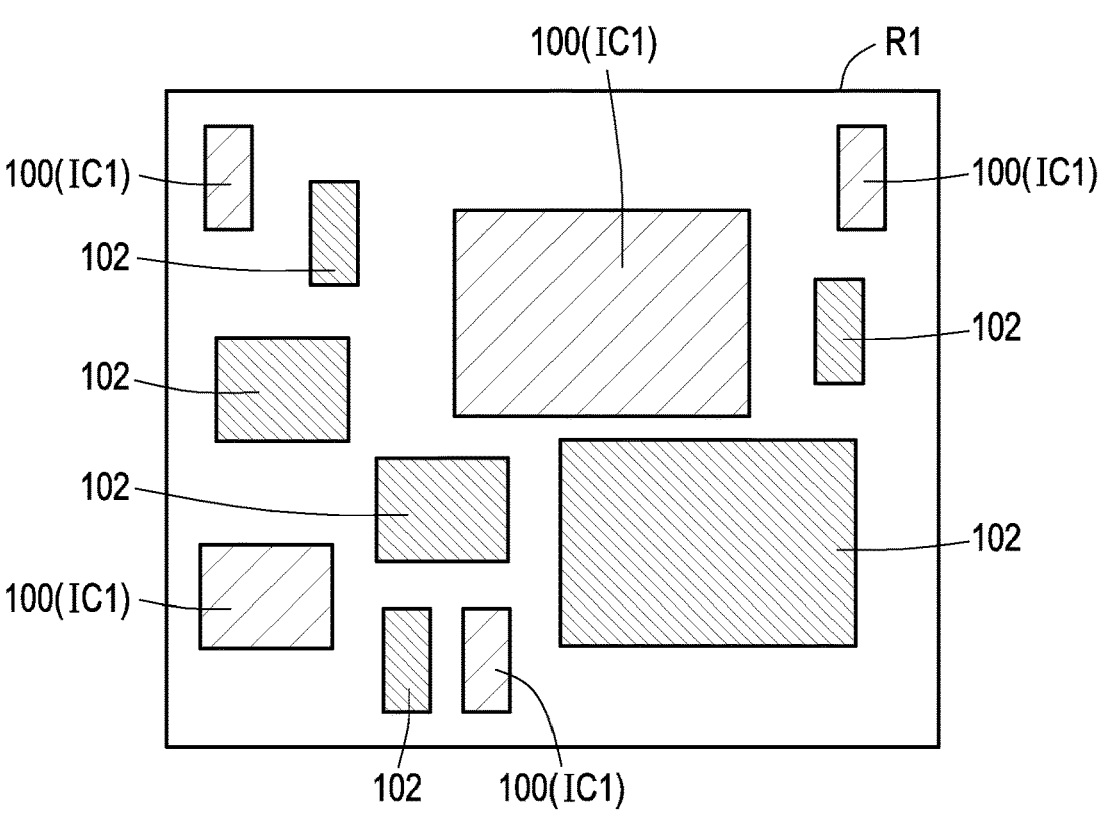
FIG. 3 is a top view illustrating a shuttle mask according to other embodiments of the invention.
Figure 3:
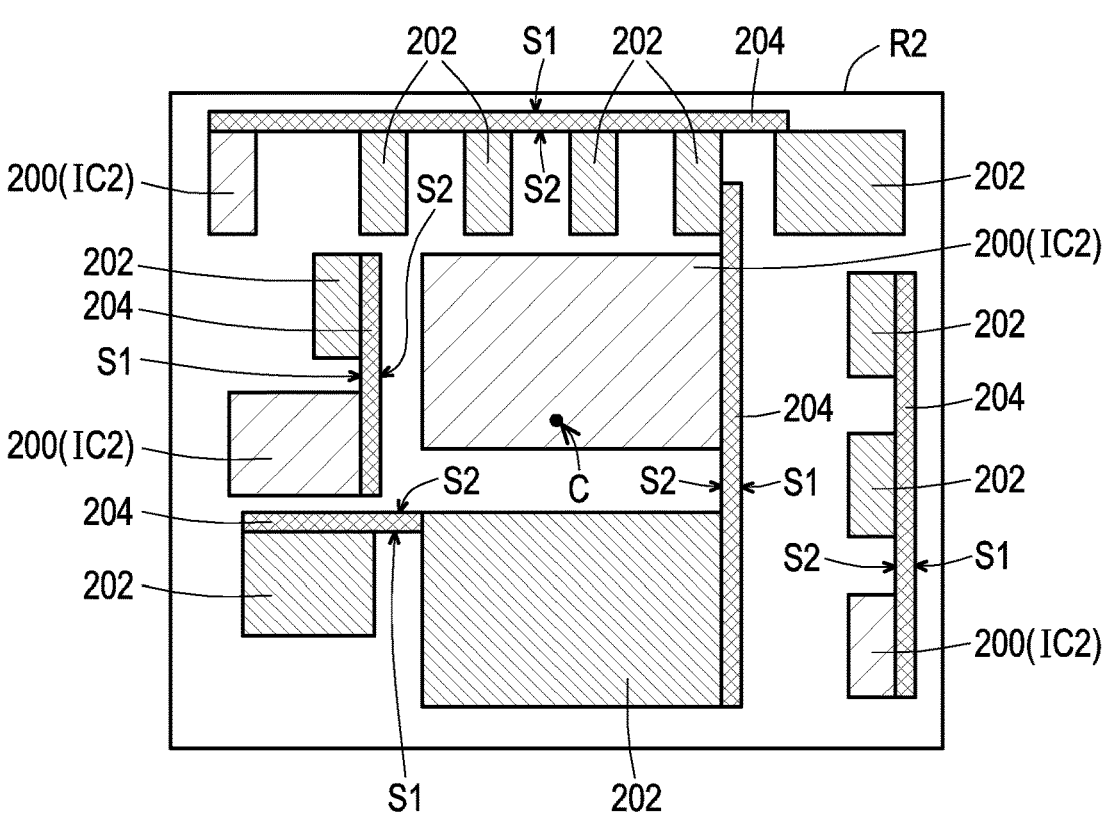

FIG. 1 is a flow chart illustrating a design method of a shuttle mask according to some embodiments of the invention. FIG. 2A to FIG. 2C are top views illustrating a design process of a shuttle mask according to some embodiments of the invention. FIG. 3 is a top view illustrating a shuttle mask according to other embodiments of the invention.

Referring to FIG. 1 and FIG. 2A, a step S100 is performed, a first IC design IC1 is provided in a first chip region R1, and a second IC design IC2 is provided in a second chip region R2. In some embodiments, the first IC design IC1 and the second IC design IC2 may be different IC designs. For example, the first IC design IC1 may be the IC design of the first IC design owner, and the second IC design IC2 may be the IC design of the second IC design owner. In the present embodiment, the design method of the shuttle mask is, for example, used to design the shuttle mask provided to the first IC design owner, but the invention is not limited thereto.

In the present embodiment, the shuttle mask layout design may have two chip regions (e.g., first chip region R1 and second chip region R2) belonging to two IC design owners (e.g., first IC design owner and second IC design owner), but the invention is not limited thereto. In other embodiments, the shuttle mask layout design may have three or more chip regions belonging to three or more IC design owners. As long as the shuttle mask layout design has chip regions belonging to IC design owners, it falls within the scope of the invention.

In the present embodiment, the shuttle mask layout design may have two IC designs (e.g., first IC design IC1 and second IC design IC2) of two IC design owners (e.g., first IC design owner and second IC design owner), but the invention is not limited thereto. In some other embodiments, the shuttle mask layout design may have three or more IC designs of three or more IC design owners. As long as the shuttle mask layout design has IC designs of IC design owners, it falls within the scope of the invention.

The first IC design IC1 includes first main patterns 100. In some embodiments, the first main pattern 100 may be a pattern for forming a pad, but the invention is not limited thereto. In some embodiments, two or more of the first main patterns 100 may have different shapes. In some embodiments, two or more of the first main patterns 100 may have the same shape. In the text, "two patterns have the same shape" may be defined as the contours of the two patterns may completely overlap. In addition, the shapes, number, and arrangement of the first main patterns 100 may be determined according to the product design and are not limited to the shapes, number, and arrangement shown in FIG. 2A. In other embodiments, all the first main patterns 100 may have different shapes. In other embodiments, all the first main patterns 100 may have the same shape.

The second IC design IC2 includes second main patterns 200. In some embodiments, the second main pattern 200 may be a pattern for forming a pad, but the invention is not limited thereto. In some embodiments, two or more of the second main patterns 200 may have different shapes. In some embodiments, two or more of the second main patterns 200 may have the same shape. In addition, the shapes, number, and arrangement of the second main patterns 200 may be determined according to the product design and are not limited to the shapes, number, and arrangement shown in FIG. 2A. In other embodiments, all the second main patterns 200 may have different shapes. In other embodiments, all the second main patterns 200 may have the same shape.

Referring to FIG. 1 and FIG. 2B, a step S102 is performed, first dummy insertion patterns 102 are added in the first chip region R1, and second dummy insertion patterns 202 are added in the second chip region R2. That is, the dummy insertion patterns may be added to all the chip regions. The first main patterns 100 and the first dummy insertion patterns 102 are separated from each other. The first dummy insertion patterns 102 are patterns formed by duplicating at least one of the first main patterns 100. The second main patterns 200 and the second dummy insertion patterns 202 are separated from each other. The second dummy insertion patterns 202 are patterns formed by duplicating at least one of the second main patterns 200.

In the present embodiment, when the design method of the shuttle mask is used to design the shuttle mask provided to the first IC design owner, the second dummy insertion patterns 202 can be used to effectively prevent the first IC design owner from knowing the second IC design IC2 of the second IC design owner from the multi-project wafer. In other embodiments, when the design method of the shuttle mask is used to design the shuttle mask provided to the second IC design owner, the first dummy insertion patterns 102 can be used to effectively prevent the second IC design owner from knowing the first IC design IC1 of the first IC design owner from the multi-project wafer. In this way, when it is not necessary to perform the following step S200, the number of the shuttle masks that need to be made can be reduced.

In some embodiments, the method of adding the first dummy insertion patterns 102 in the first chip region R1 may include randomly adding the first dummy insertion patterns 102 in the first chip region R1. In some embodiments, the method of adding the second dummy insertion patterns 202 in the second chip region R2 may include randomly adding the second dummy insertion patterns 202 in the second chip region R2.

In some embodiments, two or more of the first dummy insertion patterns 102 may have different shapes. In some embodiments, two or more of the first dummy insertion patterns 102 may have the same shape. In addition, the number and arrangement of the first dummy insertion patterns 102 may be determined according to the product design and are not limited to the number and arrangement shown in FIG. 2B. In other embodiments, all the first dummy insertion patterns 102 may have different shapes. In other embodiments, all the first dummy insertion patterns 102 may have the same shape.

In some embodiments, two or more of the second dummy insertion patterns 202 may have different shapes. In some embodiments, two or more of the second dummy insertion patterns 202 may have the same shape. In addition, the number and arrangement of the second dummy insertion patterns 202 may be determined according to the product design and are not limited to the number and arrangement shown in FIG. 2B. In other embodiments, all the second dummy insertion patterns 202 may have different shapes. In other embodiments, all the second dummy insertion patterns 202 may have the same shape.

Referring to FIG. 1, after adding the first dummy insertion patterns 102 in the first chip region R1 and adding the second dummy insertion patterns 202 in the second chip region R2, a step S104 may be performed to determine whether the number of layers of the first BEOL structure of the first IC design IC1 is the same as the number of layers of the second BEOL structure of the second IC design IC2.

In some embodiments, a step S106 may be performed to end the design process of the shuttle mask when the number of layers of the first BEOL structure of the first IC design IC1 is not the same as the number of layers of the second BEOL structure of the second IC design IC2. In this way, the shuttle mask layout design including the first main patterns 100, the second main patterns 200, the first dummy insertion patterns 102, and the second dummy insertion patterns 202 may be used to manufacture the shuttle mask. In the text, "the number of layers of the BEOL structure" may be defined as the number of layers of the interconnect structure formed after forming the semiconductor device (e.g., an active device such as a transistor device).

In some embodiments, as shown in FIG. 1 and FIG. 2C, a step S200 may be performed to add at least one dummy line 204 in the second chip region R2 when the number of layers of the first BEOL structure of the first IC design IC1 is the same as the number of layers of the second BEOL structure of the second IC design IC2. The at least one dummy line 204 may be connected to at least two selected from the second main patterns 200 and the second dummy insertion patterns 202. In some embodiments, the method of adding the at least one dummy line 204 in the second chip region R2 may include randomly adding the at least one dummy line 204 in the second chip region R2. In some embodiments, when the design method of the shuttle mask is used to design the shuttle mask provided to the first IC design owner, the dummy line is not added in the first chip region R1.

In the present embodiment, when the design method of the shuttle mask is used to design the shuttle mask provided to the first IC design owner, the at least one dummy line 204 can be used to further prevent the first IC design owner from knowing the second IC design IC2 of the second IC design owner from the multi-project wafer. In the present embodiment, the number of the dummy lines 204 is, for example, plural, but the invention is not limited thereto. As long as the number of the dummy lines 204 is at least one, it falls within the scope of the invention.

The dummy line 204 may have a first side S1 and a second side S2. The second side S2 is located between the first side S1 and the center C of the second chip region R2. In some embodiments, as shown in FIG. 2C, the number of the second dummy insertion patterns 202 connected to the first side S1 may be two or more, but the invention is not limited thereto. In other embodiments, as shown in FIG. 3, the number of the second dummy insertion patterns 202 connected to the first side S1 may be less than two. In some embodiments, as shown in FIG. 2C, the number of the second dummy insertion patterns 202 connected to the second side S2 may be less than two, but the invention is not limited thereto. In other embodiments, as shown in FIG. 3, the number of the second dummy insertion patterns 202 connected to the second side S2 may be two or more.

In other embodiments, when the design method of the shuttle mask is used to design the shuttle mask provided to the second IC design owner, at least one above-mentioned dummy line may be added in the first chip region R1, and the above-mentioned dummy line may not be added in the second chip region R2. Therefore, when the design method of the shuttle mask is used to design the shuttle mask provided to the second IC design owner, the at least one dummy line can be used to further prevent the second IC design owner from knowing the first IC design IC1 of the first IC design owner from the multi-project wafer.

After adding the at least one dummy line 204 in the second chip region R2 (step S200), a step S106 may be performed to end the design process of the shuttle mask. In this way, the shuttle mask layout design including the first main patterns 100, the second main patterns 200, the first dummy insertion patterns 102, the second dummy insertion patterns 202, and the at least one dummy line 204 may be used to manufacture the shuttle mask.

In some embodiments, the shuttle mask designed by the above design method of the shuttle mask may be a binary mask or a phase shift mask (PSM). In some embodiments, when the shuttle mask is a binary mask, the first main patterns 100, the second main patterns 200, the first dummy insertion patterns 102, the second dummy insertion patterns 202, and the at least one dummy line 204 may correspond to opaque patterns or light-transmitting patterns on the binary mask. In some embodiments, when the shuttle mask is a phase shift mask, the first main patterns 100, the second main patterns 200, the first dummy insertion patterns 102, the second dummy insertion patterns 202, and the at least one dummy line 204 may correspond to phase shift patterns or light-transmitting patterns on the phase shift mask.

Based on the above embodiments, in the design method of the shuttle mask, the first dummy insertion patterns 102 are added in the first chip region R1, and the second dummy insertion patterns 202 are added in the second chip region R2. The first main patterns 100 and the first dummy insertion patterns 102 are separated from each other, the first dummy insertion patterns 102 are patterns formed by duplicating at least one of the first main patterns 100, the second main patterns 200 and the second dummy insertion patterns 202 are separated from each other, and the second dummy insertion patterns 202 are patterns formed by duplicating at least one of the second main patterns 200. Therefore, the design method of the shuttle mask in the above embodiments can effectively prevent the IC design owner (e.g., first IC design owner) from knowing the IC design (e.g., second IC design IC2) of the other IC design owner (e.g., second IC design owner) from the multi-project wafer. In addition, the design method of the shuttle mask of the above embodiments can improve the uniformity of the pattern density on the shuttle mask.

In summary, the design method of the shuttle mask of the aforementioned embodiments can effectively prevent the IC design owner from knowing the IC design of the other IC design owner from the multi-project wafer and can improve the uniformity of the pattern density on the shuttle mask.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A design method of a shuttle mask, comprising:
providing a first integrated circuit (IC) design in a first chip region and providing a second IC design in a second chip region, wherein the first IC design includes first main patterns, and the second IC design includes second main patterns;
adding first dummy insertion patterns in the first chip region and adding second dummy insertion patterns in the second chip region; and
after adding the first dummy insertion patterns in the first chip region and adding the second dummy insertion patterns in the second chip region, determining whether the number of layers of a first back end of line (BEOL) structure of the first IC design is the same as the number of layers of a second BEOL structure of the second IC design, wherein
the first main patterns and the first dummy insertion patterns are separated from each other,
the first dummy insertion patterns are patterns formed by duplicating at least one of the first main patterns, the second main patterns and the second dummy insertion patterns are separated from each other, and
the second dummy insertion patterns are patterns formed by duplicating at least one of the second main patterns.

2. The design method of the shuttle mask according to claim 1, wherein a method of adding the first dummy insertion patterns in the first chip region comprises randomly adding the first dummy insertion patterns in the first chip region.

3. The design method of the shuttle mask according to claim 1, wherein a method of adding the second dummy insertion patterns in the second chip region comprises randomly adding the second dummy insertion patterns in the second chip region.

4. The design method of the shuttle mask according to claim 1, further comprising:
ending a design process of the shuttle mask when the number of layers of the first BEOL structure of the first IC design is not the same as the number of layers of the second BEOL structure of the second IC design.

5. The design method of the shuttle mask according to claim 1, further comprising:
adding at least one dummy line in the second chip region when the number of layers of the first BEOL structure of the first IC design is the same as the number of layers of the second BEOL structure of the second IC design, wherein
the at least one dummy line is connected to at least two selected from the second main patterns and the second dummy insertion patterns.

6. The design method of the shuttle mask according to claim 5, further comprising:
after adding the at least one dummy line in the second chip region, ending a design process of the shuttle mask.

7. The design method of the shuttle mask according to claim 5, wherein a method of adding the at least one dummy line in the second chip region comprises randomly adding the at least one dummy line in the second chip region.

8. The design method of the shuttle mask according to claim 5, wherein the at least one dummy line has a first side and a second side, the second side is located between the first side and a center of the second chip region, and the number of the second dummy insertion patterns connected to the first side is two or more.

9. The design method of the shuttle mask according to claim 5, wherein the at least one dummy line has a first side and a second side, the second side is located between the first side and a center of the second chip region, and the number of the second dummy insertion patterns connected to the second side is less than two.

10. The design method of the shuttle mask according to claim 5, wherein the at least one dummy line has a first side and a second side, the second side is located between the first side and a center of the second chip region, and the number of the second dummy insertion patterns connected to the first side is less than two.

11. The design method of the shuttle mask according to claim 5, wherein the at least one dummy line has a first side and a second side, the second side is located between the first side and a center of the second chip region, and the number of the second dummy insertion patterns connected to the second side is two or more.

12. The design method of the shuttle mask according to claim 1, wherein two or more of the first main patterns have different shapes.

13. The design method of the shuttle mask according to claim 1, wherein two or more of the first main patterns have the same shape.

14. The design method of the shuttle mask according to claim 1, wherein two or more of the second main patterns have different shapes.

15. The design method of the shuttle mask according to claim 1, wherein two or more of the second main patterns have the same shape.

16. The design method of the shuttle mask according to claim 1, wherein two or more of the first dummy insertion patterns have different shapes.

17. The design method of the shuttle mask according to claim 1, wherein two or more of the first dummy insertion patterns have the same shape.

18. The design method of the shuttle mask according to claim 1, wherein two or more of the second dummy insertion patterns have different shapes.

19. The design method of the shuttle mask according to claim 1, wherein two or more of the second dummy insertion patterns have the same shape.

\* \* \* \* \*